(12) United States Patent
Wu et al.

(10) Patent No.: US 8,219,879 B2
(45) Date of Patent: Jul. 10, 2012

(54) METHOD FOR ARRANGING MEMORIES OF LOW-COMPLEXITY LDPC DECODER AND LOW-COMPLEXITY LDPC DECODER USING THE SAME

(75) Inventors: Chien-Ming Wu, Hsinchu (TW);
Ming-Der Shieh, Hsinchu (TW);
Chun-Ming Huang, Hsinchu (TW);
Chi-Sheng Lin, Hsinchu (TW);
Shih-Hao Fang, Hsinchu (TW);
Shing-Chung Tang, Hsinchu (TW)

(73) Assignee: National Chip Implementation Center National Applied Research Laboratories, Hsinchu (TW)

( * ) Notice: Subject to any disclaimer, the term of this patent is extended or adjusted under 35 U.S.C. 154(b) by 365 days.

(21) Appl. No.: 12/707,848

(22) Filed: Feb. 18, 2010

(65) Prior Publication Data
US 2011/0138248 A1 Jun. 9, 2011

(30) Foreign Application Priority Data
Dec. 9, 2009 (TW) ................................ 98141975 A (51) Int. Cl.
*H03M 13/00* (2006.01)
*G11C 29/00* (2006.01)
*G06F 11/00* (2006.01)

(52) U.S. Cl. ......... 714/758; 714/763; 714/805; 714/815

(58) Field of Classification Search .................. None
See application file for complete search history.

(56) References Cited

U.S. PATENT DOCUMENTS

| 7,373,581 | B2 * | 5/2008 | Okamura et al. ............. 714/752 |
| 7,716,553 | B2 * | 5/2010 | Kim et al. ...................... 714/755 |
| 2005/0262420 | A1 * | 11/2005 | Park et al. ...................... 714/758 |
| 2007/0033484 | A1 * | 2/2007 | Kim et al. ...................... 714/758 |
| 2009/0125780 | A1 * | 5/2009 | Taylor et al. .................. 714/752 |
| 2009/0217121 | A1 * | 8/2009 | Yokokawa et al. ........... 714/752 |
| 2011/0161770 | A1 * | 6/2011 | Ueng et al. .................... 714/752 |

* cited by examiner

*Primary Examiner* — Guerrier Merant
(74) *Attorney, Agent, or Firm* — Stites & Harbison, PLLC; Juan Carlos A. Marquez, Esq.

(57) ABSTRACT

A method for arranging memories of a low-complexity low-density parity-check (LDPC) decoder and a low-complexity LDPC decoder using the same method are provided. The main idea of the method for arranging memories of a low-complexity LDPC decoder is to merge at least one or two small-capacity memory blocks into one memory group, so that the memory area can be reduced and the power consumption in reading or writing data is lowered. Besides, as the merged memory group shares the same address line in reading or writing data, at least one delay unit is used to adjust the reading or writing order and thereby ensure data validity. A low-complexity LDPC decoder using the disclosed method can meet the demands of high processing rate and low power consumption.

14 Claims, 12 Drawing Sheets

| 0 | 1 | 0 | 1 | 2 | 0 | 2 | 4 |

FIG. 5A

| 0 | 0 | 0 | 1 | 1 | 2 | 2 | 4 |

FIG. 10

METHOD FOR ARRANGING MEMORIES OF LOW-COMPLEXITY LDPC DECODER AND LOW-COMPLEXITY LDPC DECODER USING THE SAME

BACKGROUND OF THE INVENTION

1. Technical Field

The present invention relates to a method for arranging memories of a low-complexity low-density parity-check (LDPC) decoder and a low-complexity LDPC decoder using the same. More particularly, the present invention relates to a method for arranging memories of a low-complexity LDPC decoder and a low-complexity LDPC decoder using the same that feature low power consumption.

2. Description of Related Art

Recently, many encoding methods have been proposed for use in communication and storage systems. Low-density parity-check (LDPC) codes, in particular, have good performance in error detection and correction and can be decoded at very high speed. Quasi-cyclic LDPC codes are now mostly discussed since their parity-check matrices are composed of several regular circulant matrices and are very suitable for hardware implementation. However, in order to obtain better decoding performance, the size of the parity-check matrices is usually large and thus they must be used in conjunction with decoders having large-capacity memories.

In a conventional quasi-cyclic LDPC decoder that has a partially parallel architecture, the memory is typically divided into several memory blocks based on circulant matrices so that the operation processing units (including check node units and variable node units) can read or write data from or to the memory blocks simultaneously. Thus, not only is parallelism of operations of the LDPC decoder enhanced, but also the memory access problems associated with block rows and block columns are prevented.

Nevertheless, as the number of circulant matrices that form an LDPC matrix increases, the number of memory blocks required also increases. According to the principle of memory design, given the same total memory capacity, the memory area composed of small-capacity memory blocks is larger than that composed of large-capacity memory blocks. This explains why an LDPC decoder having a large number of small-capacity memory blocks cannot be effectively downsized. Moreover, from the perspective of hardware design, a large number of small-capacity memory blocks lead to high hardware costs and high power consumption.

BRIEF SUMMARY OF THE INVENTION

It is an objective of the present invention to provide a method for arranging memories of a low-complexity LDPC decoder and a low-complexity LDPC decoder using the same, wherein at least one or even at least two small-capacity memory blocks are merged into one large-capacity memory group to overcome the drawbacks of the prior art, such as high hardware costs and high power consumption.

It is another objective of the present invention to provide a method for arranging memories of a low-complexity LDPC decoder and a low-complexity LDPC decoder using the same, wherein at least one delay unit is used to adjust the data reading or writing order, thus maintaining the decoding speed, and reducing the memory area and power consumption, of the low-complexity LDPC decoder.

To achieve the foregoing objectives, the present invention provides a method for arranging memories of a low-complexity LDPC decoder, wherein the method includes the steps of: presetting a maximum delay unit length; reading the starting address line of each of a plurality of memory blocks, wherein each memory block saves multiple entries of data that can be sequentially read or written, starting from the corresponding starting address line, and wherein each starting address line corresponds to a starting address number; arranging the starting address numbers in order; sequentially assigning the starting address numbers to a plurality of groups such that the difference between the maximum starting address number and the minimum starting address number in each group is smaller than or equal to the maximum delay unit length, thereby producing a rearrangement result; and constructing at least one memory group by rearranging at least one said memory block according to the rearrangement result.

To achieve the foregoing objectives, the present invention also provides a low-complexity LDPC decoder which includes: at least one intrinsic memory for temporarily saving multiple entries of data; at least one check node unit for performing an operation on at least one said entry of data that correspond row-wise to a parity-check matrix; at least one variable node unit for performing an operation on at least one said entry of data that correspond column-wise to the parity-check matrix; at least one memory group, wherein each memory group is constructed by at least one memory block and configured for temporarily saving the entries of data that are needed during the operations; an address line generator for generating the plurality of address lines needed by each memory group; at least one delay unit electrically connected between at least one said check node unit and one of said memory group or between at least one said variable node unit and one of said memory group, so as to adjust the order of inputting/outputting the corresponding entries of data to or from that memory group; and at least one decoded data memory for saving decoded data generated from at least one said check node unit and at least one said variable node unit by performing the operations on the multiple entries of data.

Implementation of the present invention at least provides the following advantageous effects:

1. A method for efficiently arranging memories is provided to minimize the area taken by the memories and lower the power consumption in reading or writing data.
2. The hardware costs of low-complexity LDPC decoders can be reduced.
3. By merging a plurality of memory blocks into one memory group, the volume of a low-complexity LDPC decoder can be decreased in meeting with the demand of miniaturization of communication products.

BRIEF DESCRIPTION OF THE SEVERAL VIEWS OF THE DRAWINGS

A detailed description of further features and advantages of the present invention is given below so that a person skilled in the art can understand and implement the technical contents of the present invention and readily comprehend the objectives and advantages thereof by reference to the disclosure of the present specification and the appended claims in conjunction with the accompanying drawings, in which:

DETAILED DESCRIPTION OF THE INVENTION

Figure 1:
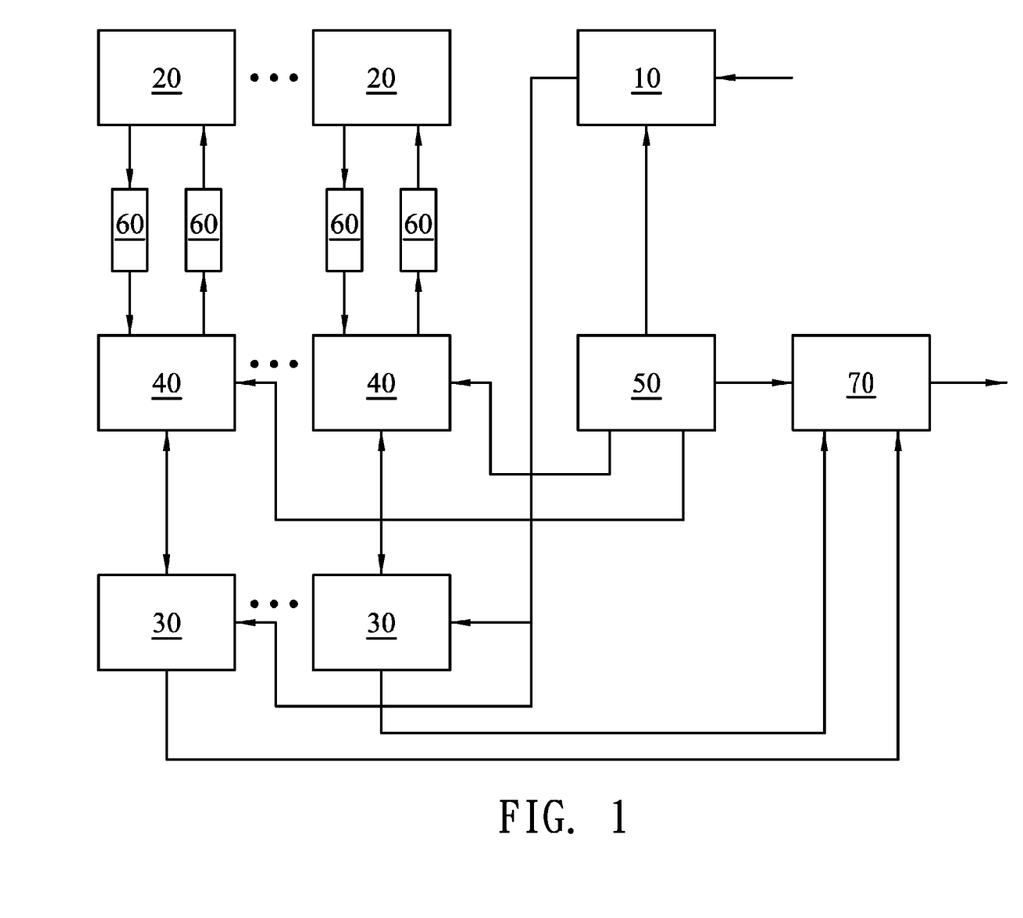
FIG. 1 is a circuit block diagram of a low-complexity LDPC decoder according to an embodiment of the present invention.

Referring to FIG. 1, a low-complexity low-density parity-check (LDPC) decoder according to an embodiment of the present invention includes: at least one intrinsic memory 10, at least one check node unit (CNU) 20, at least one variable node unit (VNU) 30, at least one memory group 40, an address line generator 50, at least one delay unit 60, and at least one decoded data memory 70.

The intrinsic memory 10 is configured to temporarily save multiple entries of data. The low-complexity LDPC decoder may include a plurality of check node units 20 and a plurality of variable node units 30. Each check node unit 20 is configured to perform an operation on data corresponding row-wise to a parity-check matrix H. Similarly, each variable node unit 30 is configured to perform an operation on data corresponding column-wise to the parity-check matrix H.

For example, a parity-check matrix H can be obtained by first defining a base matrix $H_{base}$, wherein each element of the base matrix $H_{base}$ represents a circulant submatrix of dimensions Z×Z. When Z=5, the base matrix $H_{base}$ can be expressed as $$H_{base} = \begin{bmatrix} 1 & 3 & 0 & 2 \\ 4 & 4 & 3 & 4 \end{bmatrix}.$$

Thus, according to the base matrix and the value of Z, a 10×20 parity-check matrix H is obtained as:

$$H = \begin{bmatrix} 0 & 1 & 0 & 0 & 0 & 0 & 0 & 0 & 1 & 0 & 1 & 0 & 0 & 0 & 0 & 0 & 0 & 1 & 0 & 0 \\ 0 & 0 & 1 & 0 & 0 & 0 & 0 & 0 & 0 & 1 & 0 & 1 & 0 & 0 & 0 & 0 & 0 & 0 & 1 & 0 \\ 0 & 0 & 0 & 1 & 0 & 1 & 0 & 0 & 0 & 0 & 0 & 0 & 1 & 0 & 0 & 0 & 0 & 0 & 0 & 1 \\ 0 & 0 & 0 & 0 & 1 & 0 & 1 & 0 & 0 & 0 & 0 & 0 & 0 & 1 & 0 & 1 & 0 & 0 & 0 & 0 \\ 1 & 0 & 0 & 0 & 0 & 0 & 0 & 1 & 0 & 0 & 0 & 0 & 0 & 0 & 1 & 0 & 1 & 0 & 0 & 0 \\ 0 & 0 & 0 & 0 & 1 & 0 & 0 & 0 & 0 & 1 & 0 & 0 & 0 & 1 & 0 & 0 & 0 & 0 & 0 & 1 \\ 1 & 0 & 0 & 0 & 0 & 1 & 0 & 0 & 0 & 0 & 0 & 0 & 0 & 0 & 1 & 1 & 0 & 0 & 0 & 0 \\ 0 & 1 & 0 & 0 & 0 & 0 & 1 & 0 & 0 & 0 & 1 & 0 & 0 & 0 & 0 & 0 & 1 & 0 & 0 & 0 \\ 0 & 0 & 1 & 0 & 0 & 0 & 0 & 1 & 0 & 0 & 0 & 1 & 0 & 0 & 0 & 0 & 0 & 1 & 0 & 0 \\ 0 & 0 & 0 & 1 & 0 & 0 & 0 & 0 & 1 & 0 & 0 & 1 & 0 & 0 & 0 & 0 & 0 & 0 & 1 & 0 \end{bmatrix},$$

in which the column starting indices (CSIs) of columns in each block (submatrix) can be defined as {1, 4, 0, 3}. Since each submatrix in the parity-check matrix H corresponds to one memory block 41, the foregoing parity-check matrix H corresponds to eight memory blocks 41 (2×4=8).

Figure 2A:
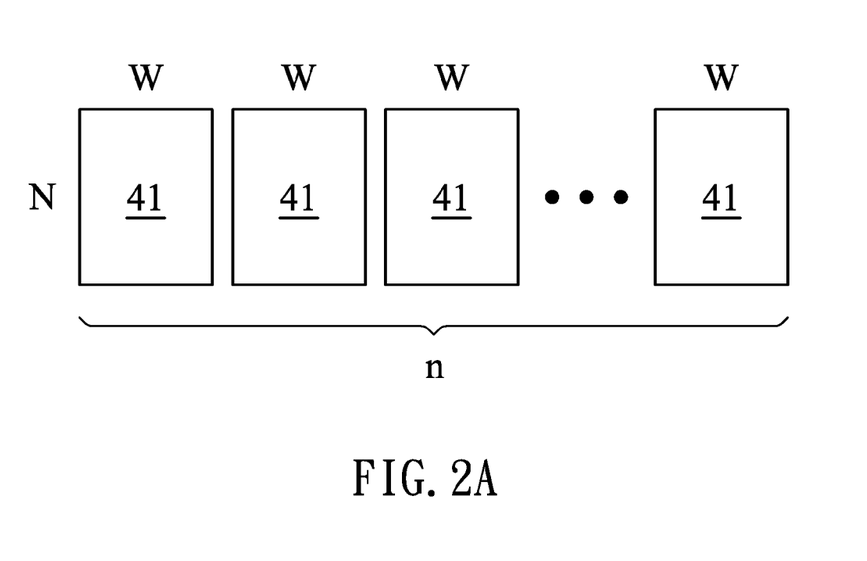
FIG. 2A is a schematic view of memory blocks yet to be merged.

Referring to FIG. 2A, the memory blocks 41 have the same data length N and the same data width W, wherein each memory block 41 can be a synchronous dynamic random access memory (SDRAM), a static random access memory (SRAM), or other memory devices. However, from the perspective of hardware design, a large number of small-capacity memory blocks 41 incur high hardware costs and high power consumption.

Figure 2B:
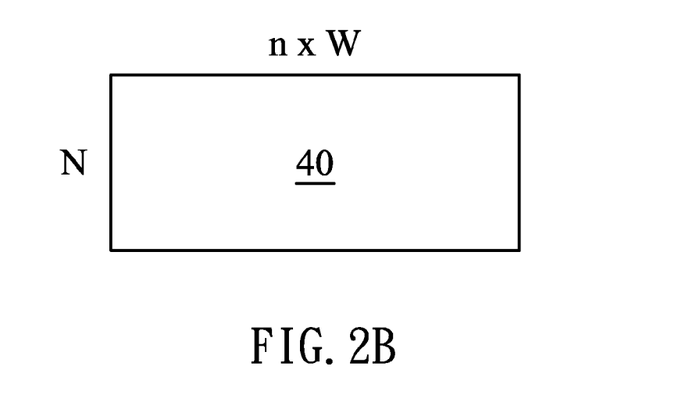
FIG. 2B is a schematic view of a merged memory group.

One solution is to construct a single memory group 40 by merging at least one or two small-capacity memory blocks 41. As shown in FIG. 2B, n small-capacity memory blocks 41 are merged into one memory group 40 for temporarily saving the data needed in performing the operations. The merging of the memory blocks 41 refers to merging a plurality of memory blocks 41 of small data widths into a single memory group 40 of a larger data width. The merging and rearrangement of the memory blocks 41 are detailed further below.

Referring back to FIG. 1, the address line generator 50 is configured to generate the plurality of address lines needed by each memory group 40. As each memory group 40 is constructed by merging at least one memory block 41, and each memory block 41 saves multiple entries of data, the address line generator 50 can assign a starting address line to each entry of data in each memory block 41, so that the reading or writing of data begins with the starting address lines.

Figure 10:
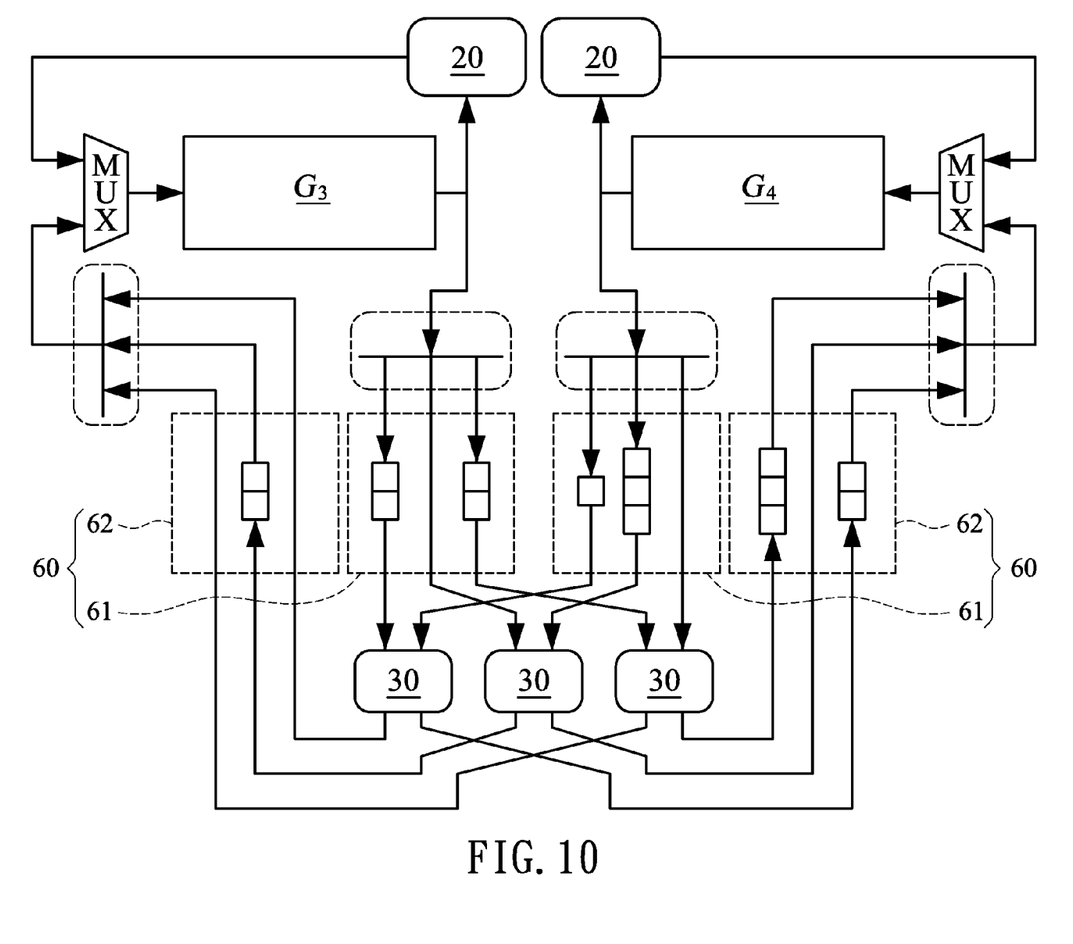
FIG. 10 is a circuit block diagram according to an embodiment of the present invention wherein delay units are used to adjust the data reading or writing order.

However, after the memory blocks 41 are merged into the single memory groups 40, the otherwise separate memory blocks 41 in the same memory group 40 must share the same address line so as for data to be read therefrom or written thereto, and yet the flexibility with which data is read from or written to the merged memory groups 40 will be lowered as a result. Moreover, data access conflict may also occur to further lower decoding speed. To solve these problems, each memory group 40 uses at least one delay unit 60 to adjust the order in which data is input to or output from the respective memory groups 40, wherein each delay unit 60 can be a first-in, first-out (FIFO) unit; a register; or a memory. If data is written to the memory blocks 41 in a column order, the delay units 60 are electrically connected between the check node units 20 and the memory groups 40, as shown in FIG. 1; if data is written to the memory blocks 41 in a row order instead, the delay units 60 are electrically connected between the variable node units 30 and the memory groups 40, as shown in FIG. 10.

As shown in FIG. 1, the decoded data memory 70 is configured to save decoded data generated from the data operations performed by the check node units 20 and the variable node units 30. The decoded data memory 70 also outputs the decoded data for subsequent use.

Figure 3:
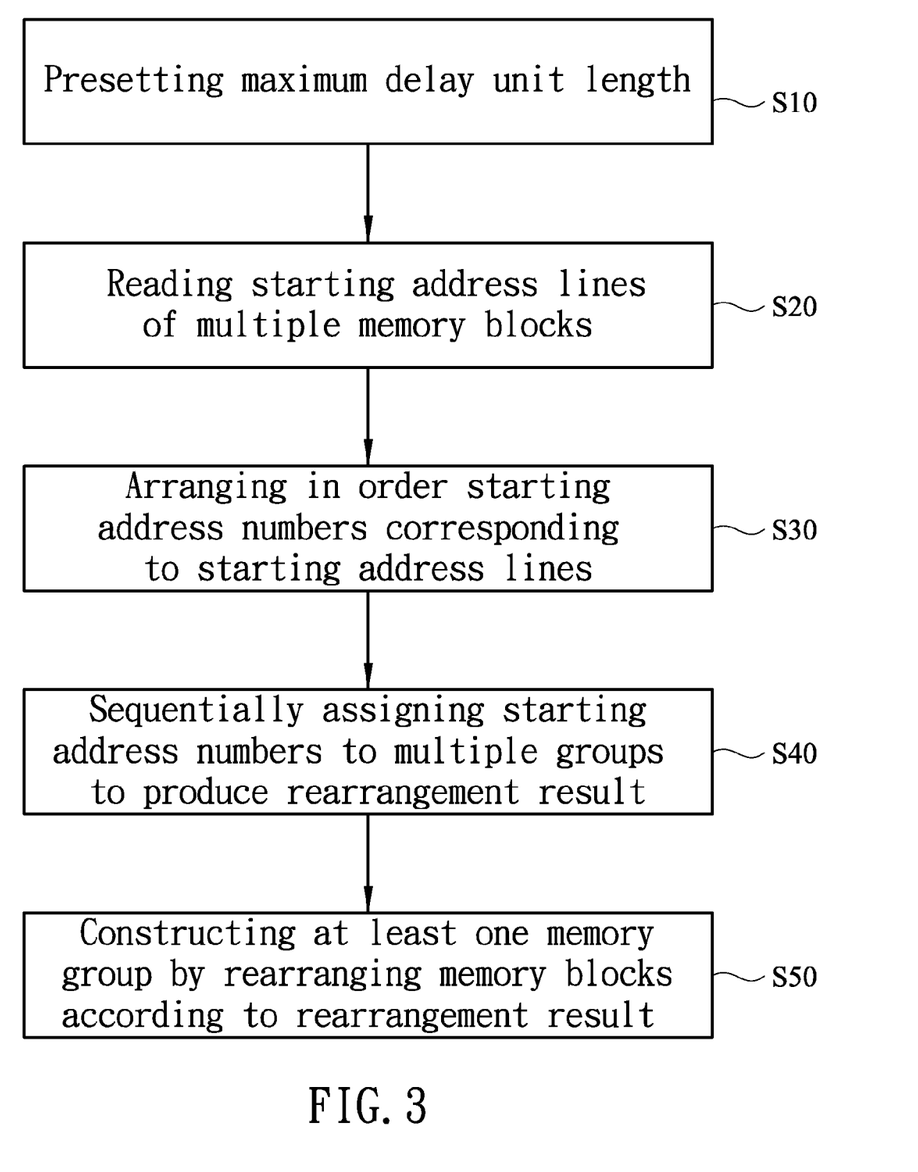
FIG. 3 is a flowchart of a method for arranging memories of a low-complexity LDPC decoder according to an embodiment of the present invention.

Referring to FIG. 3, a method for arranging memories of a low-complexity LDPC decoder according to an embodiment of the present invention includes the steps of: presetting a maximum delay unit length (step S10); reading the starting address line of each of a plurality of memory blocks (step S20); arranging in order the starting address numbers that correspond to the starting address lines (step S30); sequentially assigning the starting address numbers to a plurality of groups so as to produce a rearrangement result (step S40); and constructing at least one memory group by rearranging the memory blocks according to the rearrangement result (step S50).

The various steps of the aforesaid method for arranging memories are detailed hereinafter by means of a practical example.

In the step S10, a maximum delay unit length is preset, wherein the maximum delay unit length refers to the allowable delay length within the same memory group 40. As the maximum delay unit length increases, the number of delay units 60 needed in the low-complexity LDPC decoder increases, but the number of memory groups 40 after memory rearrangement decreases. Conversely, as the maximum delay unit length decreases, the number of delay units 60 needed in the low-complexity LDPC decoder decreases, but the number of memory groups 40 after memory rearrangement increases.

Figure 4:
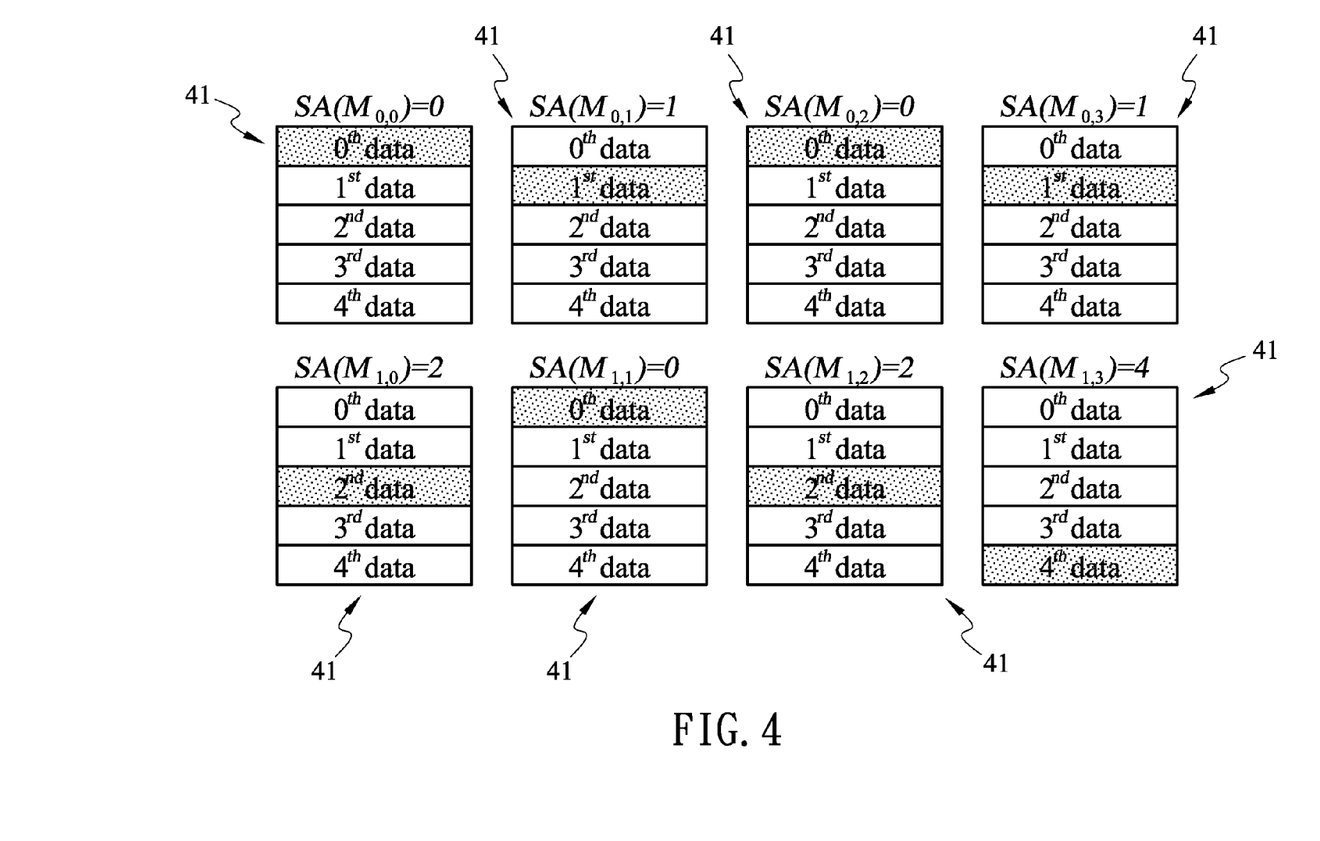
FIG. 4 is a schematic view of small-capacity memory blocks before memory rearrangement.
Figure 5A:
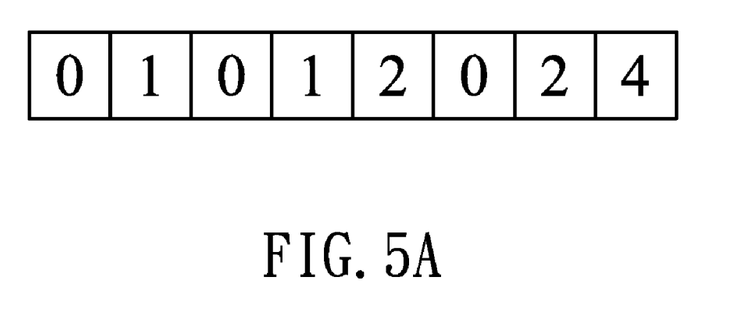
FIG. 5A shows starting address values corresponding to the memory blocks of FIG. 4.

The step S20 of reading the starting address line of each of a plurality of memory blocks is carried out as follows. For example, referring to FIG. 4, before memory rearrangement, the memory is divided into eight memory blocks 41. When data is written to the memory blocks 41 in the row order, and given the column starting indices of $\{1, 4, 0, 3\}$, the data is located as shown in FIG. 4. The shaded cells represent the first entry of data accessed by the corresponding check node unit 20. In other words, the multiple entries of data are sequentially accessed, starting from the starting address lines. Each starting address line corresponds to a starting address value represented by $SA(M_{jk})$. The starting address values corresponding to the memory blocks 41 of FIG. 4 are saved in a matrix $\Omega$, such as $$\Omega = \begin{bmatrix} 0 & 1 & 0 & 1 \\ 2 & 0 & 2 & 4 \end{bmatrix},$$

and tabulated as shown in FIG. 5A.

Figure 5B:
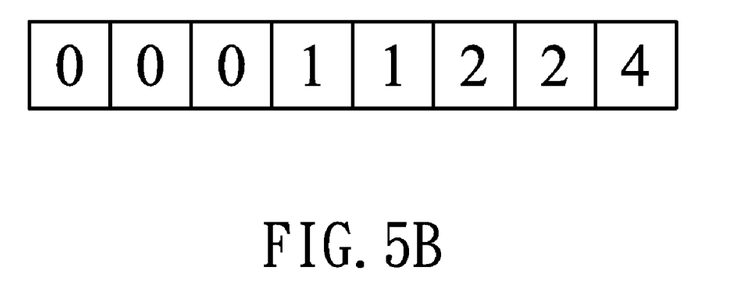
FIG. 5B shows the starting address values of FIG. 5A arranged in order of value.

In the step S30 of arranging in order the starting address numbers that correspond to the starting address lines, the starting address numbers shown in FIG. 5A are rearranged in order of value, as shown in FIG. 5B.

Figure 6A:
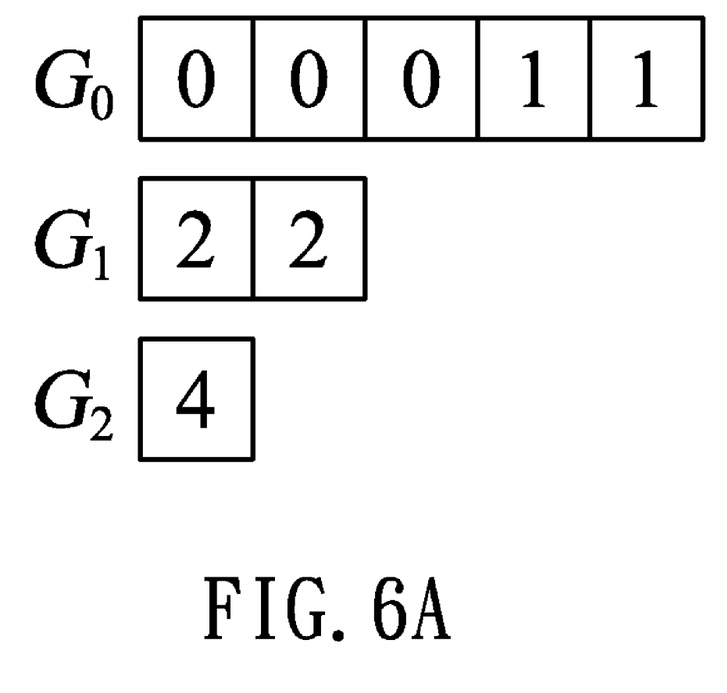
FIG. 6A shows a rearrangement result produced by assigning the starting address values of FIG. 5B according to the order of value.

The step S40 of sequentially assigning the starting address numbers to a plurality of groups so as to produce a rearrangement result is described as follows. Referring to FIG. 6A, the memory blocks 41 corresponding to the starting address values shown in FIG. 5B are sequentially assigned to a plurality of groups $G_0$, $G_1$, and $G_2$, in an ascending order of the starting address values. The assignment of the starting address values is based on the principle that the difference between the maximum starting address value and the minimum starting address value corresponding to the memory blocks 41 in each group $G_0$, $G_1$, or $G_2$ should be smaller than or equal to the maximum delay unit length. Thus, a rearrangement result is produced.

For instance, if the maximum delay unit length is set as 1, and the starting address values shown in FIG. 5B are sequentially assigned to the first group $G_0$ (representing a first memory group $G_0$), the second group $G_1$ (representing a second memory group $G_1$), and the third group $G_2$ (representing a third memory group $G_2$), then the first group $G_0$ includes the memory blocks 41 corresponding to the five starting address values "0", "0", "0", "1", and "1"; the second group $G_1$ includes the memory blocks 41 corresponding to the two starting address values "2" and "2"; and the third group $G_2$ includes the memory block 41 corresponding to the starting address value "4". Hence, the starting address values shown in FIG. 5B are sequentially assigned to the three groups $G_0$, $G_1$, and $G_2$, thereby producing a rearrangement result.

Figure 6B:
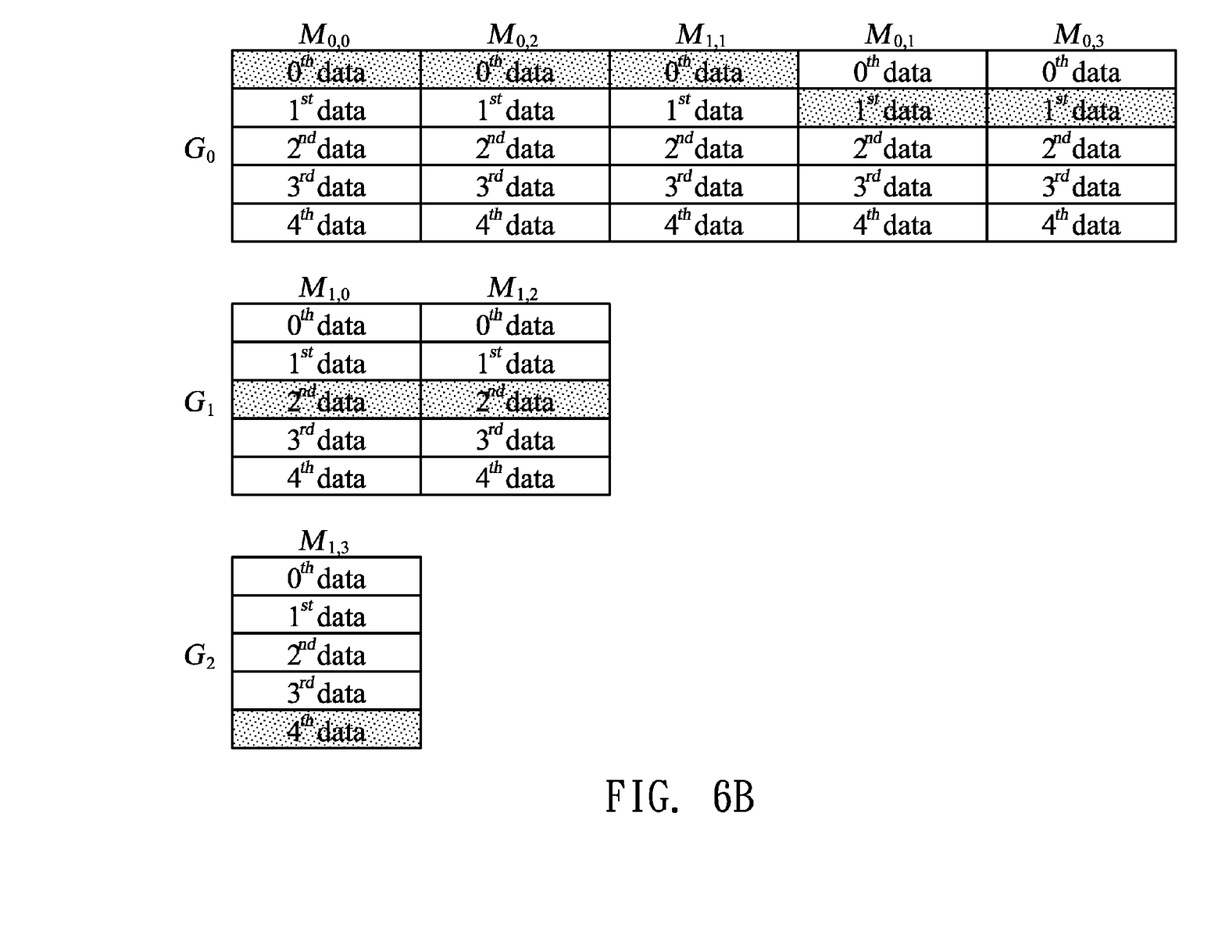
FIG. 6B is a schematic view of memory groups constructed according to the rearrangement result of FIG. 6A.

The step S50 of constructing at least one memory group by rearranging the memory blocks according to the rearrangement result is further described with reference to FIG. 6B. The memory blocks 41 are rearranged according to the rearrangement result of FIG. 6A so as to construct three memory groups ($G_0$, $G_1$, and $G_2$). When any of the memory groups $G_0$, $G_1$, and $G_2$ contains different starting address values, the order of reading or writing data from or to that particular memory group can be adjusted by at least one delay unit 60, as shown in FIG. 1 and FIG. 10. For example, the first memory group $G_0$ shown in FIG. 6B contains different starting address values. Therefore, the first memory group $G_0$ needs at least one delay unit 60 for adjusting the order of reading or writing data from or to the first memory group $G_0$, so as to prevent data access conflict.

Figure 7:
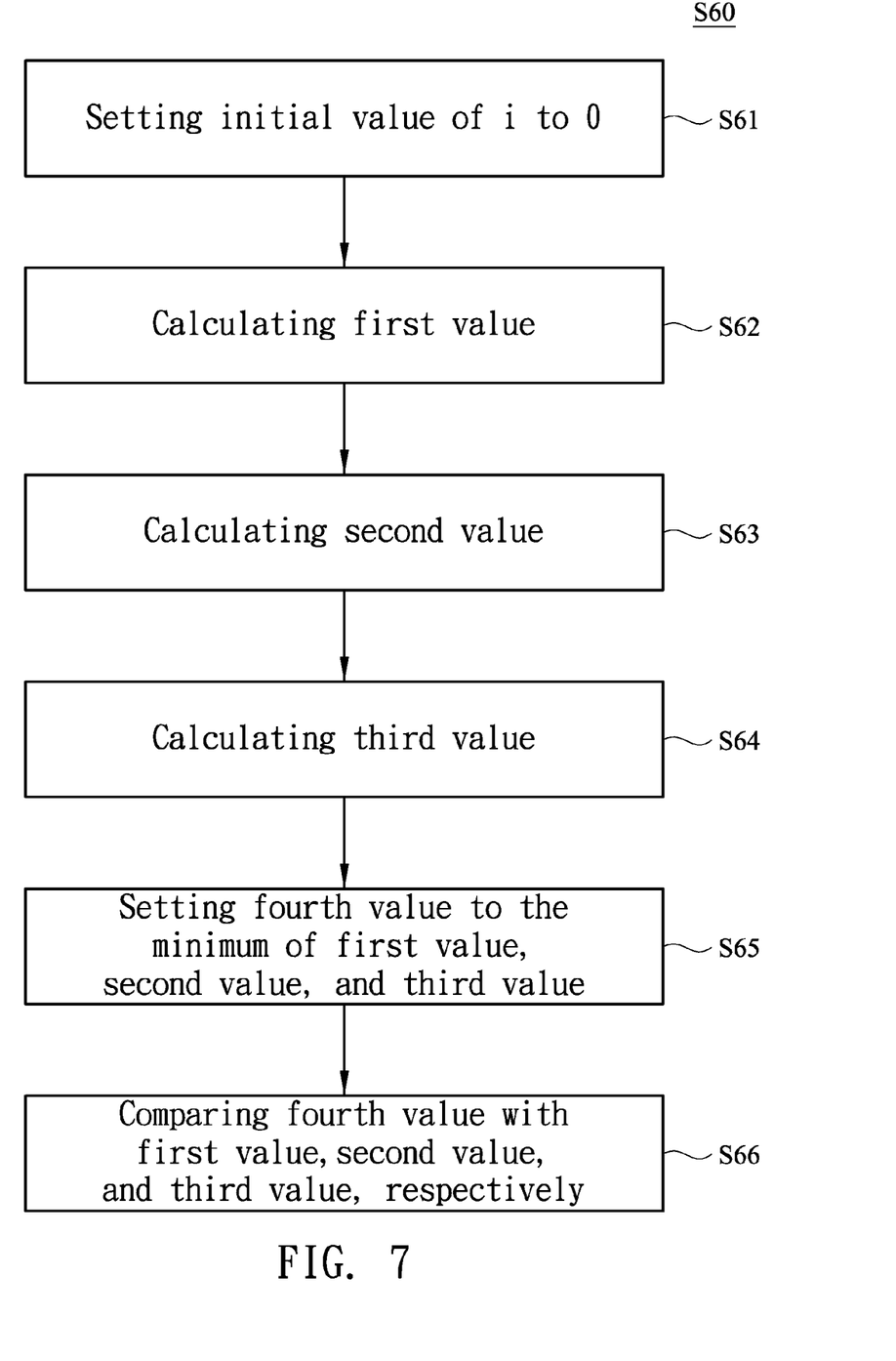
FIG. 7 is a flowchart of a method for fine-tuning memory arrangement according to an embodiment of the present invention.

Continued from the above description, each memory group 40 may at least include a $G_i^{th}$ memory group and a $G_{i+1}^{th}$ memory group, such as the aforesaid first memory group $G_0$, second memory group $G_1$, and third memory group $G_2$. In order to reduce the number of delay units 60 used by the memory groups $G_0$, $G_1$, and $G_2$, an additional fine-tuning step S60 is performed. Referring to FIG. 7, the fine-tuning step S60 includes the steps of: setting the initial value of i to 0 (step 61); calculating a first value (step S62); calculating a second value (step S63); calculating a third value (step S64); setting a fourth value to the minimum of the first value, the second value, and the third value (step S65); and comparing the fourth value with the first value, the second value, and the third value, respectively (step S66).

The number of delay units 60 needed by the memory groups $G_0$, $G_1$, and $G_2$ constructed by the memory blocks 41 in different rearrangement modes can be known by the following equation, which determines the number of delay units 60 needed by the $G_i^{th}$ memory group and the $G_{i+1}^{th}$ memory group:

$N(G_i, G_{i+1}) = (\max(G_i) - \min(G_i)) \times |G_i| + (\max(G_{i+1}) - \min(G_{i+1})) \times |G_{i+1}|$, where $N(G_i, G_{i+1})$ represents the total number of delay units 60 needed by the $G_i^{th}$ memory group and the $G_{i+1}^{th}$ memory group; $\max(G_i)$ and $\min(G_i)$ represent the maximum starting address number and the minimum starting address number corresponding to the memory blocks 41 in the $G_i^{th}$ memory group, respectively; and $|G_i|$ represents the number of memory blocks 41 in the $G_i^{th}$ memory group.

In the step S61, the initial value of i is set to 0, which means that calculation starts from the $G_0^{th}$ memory group.

In the step S62, a first value is calculated, wherein the first value represents the total number of delay units 60 corresponding to the $G_i^{th}$ memory group and the $G_{i+1}^{th}$ memory group. Continued from the foregoing example, as shown in FIG. 6A, the first memory group $G_0$ and the second memory group $G_1$ use a total of five delay units 60 ($N_0(G_0, G_1) = (1-0) \times 5 + (2-2) \times 2 = 5$).

Figure 8A:
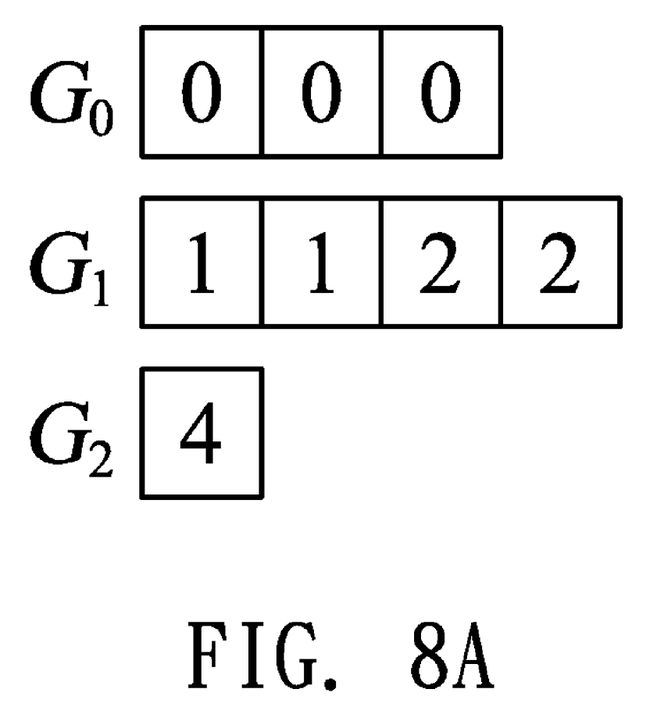
FIG. 8A shows the rearrangement result of FIG. 6A after fine-tuning.
Figure 8B:
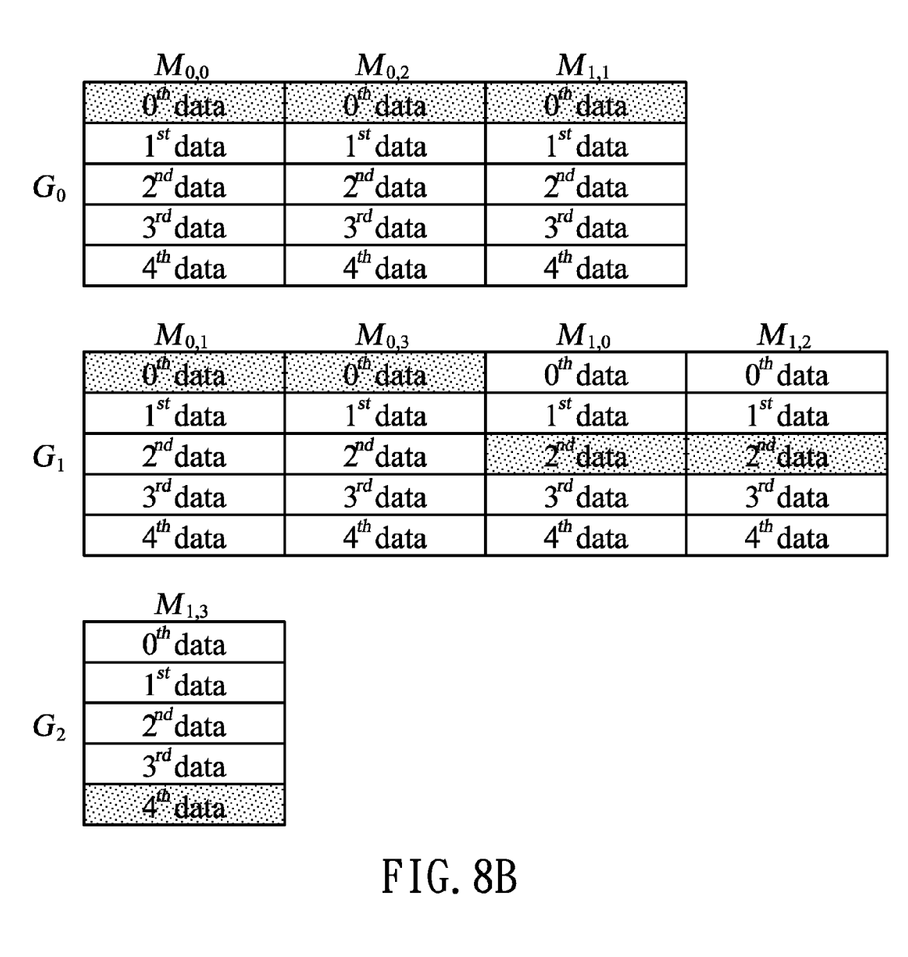
FIG. 8B is a schematic view of memory groups constructed according to the rearrangement result of FIG. 8A.

In the step S63, a second value is calculated, wherein the second value represents the total number of delay units 60 corresponding to the $G_i^{th}$ memory group and the $G_{i+1}^{th}$ memory group after the memory block 41 with the maximum starting address value in the $G_i^{th}$ memory group is merged into the $G_{i+1}^{th}$ memory group. If the difference between the maximum starting address value and the minimum starting address value corresponding to the memory blocks 41 in the merged $G_{i+1}^{th}$ memory group is larger than the preset maximum delay unit length, the second value is set to infinity. Continued from the foregoing example, after the memory block 41 with the maximum starting address value in the first memory group $G_0$ is merged into the second memory group $G_1$, as shown in FIG. 8A and FIG. 8B, a total of four delay units 60 are used by the first memory group $G_0$ and the second memory group $G_1$ ($N_1(G_0, G_1) = (0-0) \times 3 + (2-1) \times 4 = 4$).

Figure 9:
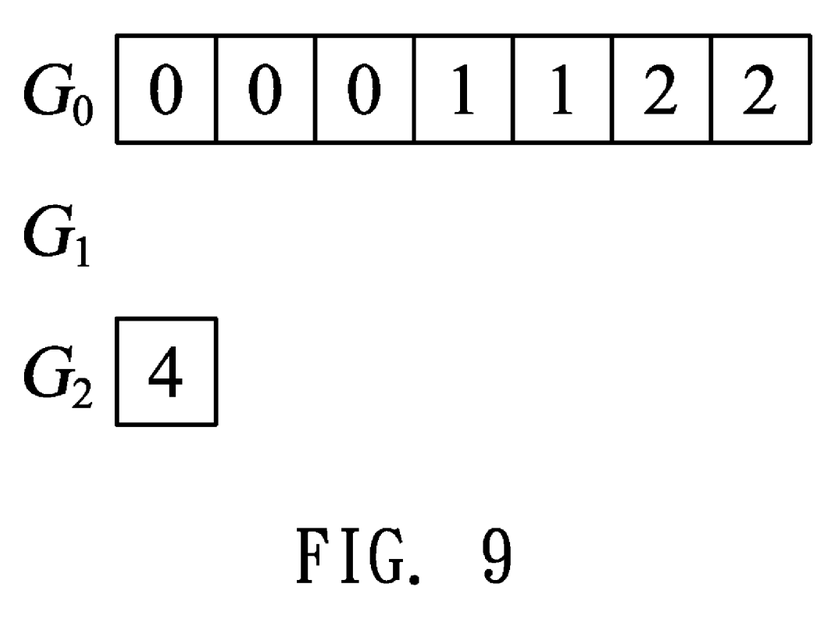
FIG. 9 shows the rearrangement result of FIG. 6A after another fine-tuning.

In the step S64, a third value is calculated, wherein the third value represents the total number of delay units 60 corresponding to the $G_i^{th}$ memory group and the $G_{i+1}^{th}$ memory group after the memory block 41 with the minimum starting address value in the $G_{i+1}^{th}$ memory group is merged into the $G_i^{th}$ memory group. If the difference between the maximum starting address value and the minimum starting address value corresponding to the memory blocks 41 in the merged $G_i^{th}$ memory group is larger than the preset maximum delay unit length, the third value is set to infinity. Continued from the previous example, after the memory block 41 with the minimum starting address value in the second memory group $G_1$ is merged into the first memory group $G_0$, as shown in FIG. 9, the difference between the maximum starting address value and the minimum starting address value corresponding to the memory blocks 41 in the merged $G_i^{th}$ memory group is larger than 1, so the third value is set to infinity ($N_2(G_0, G_1)=\infty$).

In the step S65, a fourth value is set to the minimum of the first value, the second value, and the third value. More specifically, in order to know which rearrangement mode allows the use of a relatively small number of delay units 60, the minimum of the first value, the second value, and the third value is selected as the fourth value and serves as a basis of comparison. Continued from the previous example, the second value is set as the fourth value.

In the step S66, the fourth value is compared with the first value, the second value, and the third value, respectively. If i is not equal to 0, and the second value is equal to the fourth value, the rearrangement mode corresponding to the second value allows a relatively small number of delay units 60 to be used. In that case, the memory block 41 with the maximum starting address value in the $G_i^{th}$ memory group is merged into the $G_{i+1}^{th}$ memory group, and after setting i to i−1, the first through the third values are calculated again.

On the other hand, if i is not equal to 0, and the third value is equal to the fourth value, the rearrangement mode corresponding to the third value allows a relatively small number of delay units 60 to be used. Hence, the memory block 41 with the minimum starting address number in the $G_{i+1}^{th}$ memory group is merged into the $G_i^{th}$ memory group, and after setting i to i−1, calculation of the first value, the second value, and the third value is conducted again.

However, if i is equal to 0, and the second value is equal to the fourth value, the memory block 41 with the maximum starting address value in the $G_i^{th}$ memory group is merged into the $G_{i+1}^{th}$ memory group, and after setting i to 0, the first value, the second value, and the third value are calculated once more. If i is equal to 0, and the third value is equal to the fourth value, the memory block 41 with the minimum starting address number in the $G_{i+1}^{th}$ memory group is merged into the $G_i^{th}$ memory group, and without changing the value of i, calculation of the first value, the second value, and the third value is conducted again.

If the first value is equal to the fourth value, the rearrangement mode corresponding to the first value already allows the use of a relatively small number of delay units 60. If i is not equal to the number of the memory groups 40 minus 1, then i is set to i+1, and the first value, the second value, and the third value are calculated again. The aforesaid calculation processes are repeated until i is equal to the number of the memory groups 40 minus 1, which concludes the fine-tuning step S60.

The fine-tuning step S60 is intended to adjust the rearrangement mode of the memory blocks 41 so as to minimize the number of delay units 60 to be used. According to the foregoing description, with the second value being equal to the fourth value, the memory block 41 with the maximum starting address value in the first memory group $G_0$ is merged into the second memory group $G_1$ (i.e., the memory groups 40 are constructed according to the rearrangement result shown in FIG. 8A and FIG. 8B), so as to enable the use of a relatively small number of delay units 60 (only four delay units 60 are used), thereby maintaining data validity while lowering power consumption.

Please refer to FIG. 10 for a circuit block diagram which mainly shows the check node units 20, variable node units 30, and delay units 60 of a low-complexity LDPC decoder according to another embodiment of the present invention. This embodiment serves to demonstrate that, in addition to being connected between the check node units 20 and the memory groups 40, as shown in FIG. 1, the delay units 60 can also be connected between the variable node units 30 and memory groups $G_3$ and $G_4$.

The structure shown in FIG. 10 includes two check node units 20, three variable node units 30, and two memory groups $G_3$ and $G_4$, wherein each of the memory groups $G_3$ and $G_4$ is constructed by merging a plurality of memory blocks. According to the structure shown in FIG. 10, all the data needed by the check node units 20 are located in the same address line, and as a consequence, no additional delay units 60 are required for adjusting the order of inputting data into the check node units 20.

However, when the variable node units 30 are used to perform data operations, it may be impossible for the variable node units 30 to read all the needed data at the same time. Hence, delay units 61 designed specifically for use in reading data (also known as Read-FIFOs) 61 are necessitated. The Read-FIFOs 61 serve two main purposes: to arrange data read at different times into the formats required by the variable node units 30; and to preserve the already-read data and deliver them to the variable node units 30 when appropriate, thus reducing the number of times that data must be read.

In addition, it may also be impossible to write all the data to the memory groups $G_3$ and $G_4$ at the same time. Therefore, delay units designed specifically for use in writing data (also know as Write-FIFOs) 62 must be used to perform permutation and combination on the operation results output from the variable node units 30, thus arranging the operation results in a proper order in which they can be written to the memory groups $G_3$ and $G_4$ at the same time. Furthermore, each data path in the memory groups $G_3$ and $G_4$ has its own independent Read-FIFOs 61 and Write-FIFOs 62 in order for data to properly reach and be written to the correct locations.

The embodiments described above are provided to demonstrate the features of the present invention so that a person skilled in the art can understand the contents disclosed herein and implement the present invention accordingly. The embodiments, however, are not intended to limit the scope of the present invention, which is defined only by the appended claims. Therefore, all equivalent changes or modifications which do not depart from the spirit of the present invention should fall within the scope of the appended claims.

What is claimed is:

1. A method for arranging memories of a low-complexity low-density parity-check (LDPC) decoder, comprising steps of:

presetting a maximum delay unit length;

reading a starting address line of each of a plurality of memory blocks, wherein each said memory block saves multiple entries of data, and the multiple entries of data in each said memory block are sequentially read or written, starting from a corresponding said starting address line, each said starting address line corresponding to a starting address number;

arranging the starting address numbers in order;

sequentially assigning the starting address numbers to a plurality of groups such that a difference between a maximum said starting address number and a minimum said starting address number in each said group is smaller than or equal to the maximum delay unit length, thereby producing a rearrangement result; and constructing at least one memory group by rearranging at least one said memory block according to the rearrangement result.

2. The method of claim 1, wherein the starting address values are expressed by a matrix.

3. The method of claim 1, wherein the rearrangement result is a sequential assignment of the starting address numbers in an ascending order of the starting address values.

4. The method of claim 1, wherein when one said memory group includes different said starting address values, the memory group further uses at least one delay unit to adjust an order in which said entries of data are read from or written to the memory group.

5. The method of claim 4, wherein the said memory group comprises a $G_i^{th}$ memory group and a $G_{i+1}^{th}$ memory group, and the step of constructing the memory group according to the rearrangement result is further followed by a fine-tuning step for reducing the number of said delay units used by the memory group.

6. The method of claim 5, wherein the fine-tuning step comprises steps of:

setting an initial value of i to 0;

calculating a first value, wherein the first value represents a total number of said delay units corresponding to the $G_i^{th}$ memory group and the $G_{i+1}^{th}$ memory group;

calculating a second value, wherein the second value represents a total number of said delay units corresponding to the $G_i^{th}$ memory group and the $G_{i+1}^{th}$ memory group after one said memory block with a maximum said starting address number in the $G_i^{th}$ memory group is merged into the $G_{i+1}^{th}$ memory group;

calculating a third value, wherein the third value represents a total number of said delay units corresponding to the $G_i^{th}$ memory group and the $G_{i+1}^{th}$ memory group after one said memory block with a minimum said starting address number in the $G_{i+1}^{th}$ memory group is merged into the $G_i^{th}$ memory group;

setting a fourth value to a minimum of the first value, the second value, and the third value;

comparing the fourth value with the first value, the second value, and the third value, respectively;

merging the memory block with the maximum starting address value in the $G_i^{th}$ memory group into the $G_{i+1}^{th}$ memory group if the second value is equal to the fourth value and i is equal to 0, and recalculating the first value, the second value, and the third value after setting i to 0;

merging the memory block with the maximum starting address value in the $G_i^{th}$ memory group into the $G_{i+1}^{th}$ memory group if the second value is equal to the fourth value and i is not equal to 0, and recalculating the first value, the second value, and the third value after setting i to i−1;

merging the memory block with the minimum starting address value in the $G_{i+1}^{th}$ memory group into the $G_i^{th}$ memory group if the third value is equal to the fourth value and i is equal to 0, and recalculating the first value, the second value, and the third value without changing i;

merging the memory block with the minimum starting address value in the $G_{i+1}^{th}$ memory group into the $G_i^{th}$ memory group if the third value is equal to the fourth value and i is not equal to 0, and recalculating the first value, the second value, and the third value after setting i to i−1;

recalculating the first value, the second value, and the third value after setting i to i+1, if the first value is equal to the fourth value and i is not equal to the number of the memory group minus 1; and terminating the fine-tuning step if the first value is equal to the fourth value and i is equal to the number of the memory group minus 1.

7. A low-complexity low-density parity-check (LDPC) decoder, comprising:

at least one intrinsic memory for temporarily saving multiple entries of data;

at least one check node unit for performing an operation on at least one said entry of data corresponding row-wise to a parity-check matrix;

at least one variable node unit for performing an operation on at least one said entry of data corresponding column-wise to the parity-check matrix;

at least one memory group, wherein each said memory group is constructed by at least one memory block and configured for temporarily saving said entries of data necessary to the operations;

an address line generator for generating a plurality of address lines necessary to each said memory group;

at least one delay unit electrically connected between at least one said check node unit and one said memory group or between at least one said variable node unit and one said memory group, so as to adjust an order of inputting/outputting corresponding said entries of data to or from the memory group; and at least one decoded data memory for saving decoded data generated from at least one said check node unit and at least one said variable node unit by performing the operations on said entries of data.

8. The low-complexity LDPC decoder of claim 7, wherein each said delay unit is a first-in, first-out (FIFO) unit; a register; or a memory.

9. The low-complexity LDPC decoder of claim 7, wherein each said memory group is constructed by at least one said memory block via a method for arranging memories, the method comprising steps of:

presetting a maximum delay unit length;

reading a starting address line of each said memory block, wherein said entries of data in each said memory block are sequentially read or written, starting from a corresponding said starting address line, and each said starting address line corresponds to a starting address number;

arranging the starting address numbers in order;

sequentially assigning the starting address numbers to a plurality of groups such that a difference between a maximum said starting address number and a minimum said starting address number in each said group is smaller than or equal to the maximum delay unit length, thereby producing a rearrangement result; and constructing at least one said memory group by rearranging at least one said memory block according to the rearrangement result.

10. The low-complexity LDPC decoder of claim 9, wherein the starting address values are expressed by a matrix.

11. The low-complexity LDPC decoder of claim 9, wherein the rearrangement result is a sequential assignment of the starting address numbers in an ascending order of the starting address values.

12. The low-complexity LDPC decoder of claim 9, wherein when one said memory group includes different said starting address values, the memory group uses at least one said delay unit to adjust an order in which said entries of data are read from or written to the memory group.

13. The low-complexity LDPC decoder of claim 9, wherein at least one said memory group comprises a $G_i^{th}$ memory group and a $G_{i+1}^{th}$ memory group, and the step of constructing at least one said memory group according to the rearrangement result further is followed by a fine-tuning step for reducing the number of said delay units used by at least one said memory group.

14. The low-complexity LDPC decoder of claim 13, wherein the fine-tuning step comprises steps of:
   setting an initial value of i to 0;
   calculating a first value, wherein the first value represents a total number of said delay units corresponding to the $G_i^{th}$ memory group and the $G_{i+1}^{th}$ memory group;
   calculating a second value, wherein the second value represents a total number of said delay units corresponding to the $G_i^{th}$ memory group and the $G_{i+1}^{th}$ memory group after one said memory block with a maximum said starting address number in the $G_i^{th}$ memory group is merged into the $G_{i+1}^{th}$ memory group;
   calculating a third value, wherein the third value represents a total number of said delay units corresponding to the $G_i^{th}$ memory group and the $G_{i+1}^{th}$ memory group after one said memory block with a minimum said starting address number in the $G_{i+1}^{th}$ memory group is merged into the $G_i^{th}$ memory group;
   setting a fourth value to a minimum of the first value, the second value, and the third value;
   comparing the fourth value with the first value, the second value, and the third value, respectively;
   merging the memory block with the maximum starting address value in the $G_i^{th}$ memory group into the $G_{i+1}^{th}$ memory group if the second value is equal to the fourth value and i is equal to 0, and recalculating the first value, the second value, and the third value after setting i to 0;
   merging the memory block with the maximum starting address value in the $G_i^{th}$ memory group into the $G_{i+1}^{th}$ memory group if the second value is equal to the fourth value and i is not equal to 0, and recalculating the first value, the second value, and the third value after setting i to i−1;
   merging the memory block with the minimum starting address value in the $G_{i+1}^{th}$ memory group into the $G_i^{th}$ memory group if the third value is equal to the fourth value and i is equal to 0, and recalculating the first value, the second value, and the third value without changing i;
   merging the memory block with the minimum starting address value in the $G_{i+1}^{th}$ memory group into the $G_i^{th}$ memory group if the third value is equal to the fourth value and i is not equal to 0, and recalculating the first value, the second value, and the third value after setting i to i−1;
   recalculating the first value, the second value, and the third value after setting i to i+1, if the first value is equal to the fourth value and i is not equal to the number of the memory group minus 1; and
   terminating the fine-tuning step if the first value is equal to the fourth value and i is equal to the number of the memory group minus 1.

\* \* \* \* \*